United States Patent [19]

Takahashi et al.

[11] 4,228,454

[45] Oct. 14, 1980

[54] HIGH TEMPERATURE CADMIUM BORACITE SEMICONDUCTOR DEVICE

[75] Inventors: Tatsuo Takahashi, Isehara; Osamu Yamada, Tama, Japan

[73] Assignee: RCA Corporation, New York, N.Y.

[21] Appl. No.: 880,484

[22] Filed: Feb. 23, 1978

[51] Int. Cl.2 ........................ H01L 29/24; H01L 29/46

[52] U.S. Cl. ................................. 357/61; 252/62.3 V; 357/1; 357/2; 357/10; 423/277; 307/310

[58] Field of Search .................. 252/62.3 R, 62.3 GA, 252/62.3 ZB, 62.3 ZT, 62.3 V, 518; 423/593, 592, 277; 357/1, 2, 4, 6, 10, 61

[56] References Cited

U.S. PATENT DOCUMENTS

| | | | |
|---|---|---|---|
| 3,491,026 | 1/1970 | Lehmann et al. | 357/61 |
| 3,686,096 | 8/1972 | Hed et al. | 357/2 |
| 3,714,633 | 1/1973 | Epstein et al. | 357/1 |
| 3,925,537 | 12/1975 | Bither, Jr. | 423/277 |

OTHER PUBLICATIONS

Journal of Crystal Growth, 33, (1976), pp. 361-364.

Jona, "Preparation . . . Boracite-Like Compounds," J. Phys. Chem., 63, (1959), pp. 1750-1752.

*Primary Examiner*—William D. Larkins

*Attorney, Agent, or Firm*—Birgit E. Morris; A. Stephen Zavell

[57] ABSTRACT

A cadmium boracite crystal electronic device, having at least one silver containing electrode, which is useful as a symmetric current controlling device for DC, DC pulse and AC circuits, an asymmetric current controlling device for DC and DC pulse circuits, a current rectifier for low frequency, AC, and as a temperature sensor.

11 Claims, 9 Drawing Figures

HIGH TEMPERATURE CADMIUM BORACITE SEMICONDUCTOR DEVICE

This invention relates to current controlling devices. More specifically, this invention relates to cadmium boracite current controlling devices and rectifiers operative at high temperatures.

BACKGROUND OF THE INVENTION

Designing circuits, current controlling devices and rectifiers which are operative at temperatures in excess of 125° C. is extremely difficult. Certain applications, such as space electronics or solid state devices which are too compact for heat sinks, require device operation at substantially higher temperatures.

Thus, temperature sensors, current controlling devices, and rectifiers operative at high temperatures would be highly desirable.

SUMMARY OF THE INVENTION

Electronic devices containing cadmium boracite crystals and at least one silver electrode, exhibit a temperature dependent low conductivity state which is independent of applied voltage and a higher conductivity state which is dependent upon applied voltage. The cadmium boracite crystals are useful in making high temperature symmetric current controlling devices for DC, DC pulse and AC circuits, asymmetric current controlling devices for DC and DC pulse circuits, current rectifiers for low frequency AC, and temperature sensors.

DETAILED DESCRIPTION OF THE INVENTION

Cadmium boracite single crystals having the formula $$Cd_3B_7O_{13}X$$

wherein X is Cl or Br, are known. The single crystals may be produced by chemical vapor transport. See Journal of Crystal Growth 33 (1976), 361-364. The cadmium boracite single crystals exhibit high resistivity at room temperature and are considered insulators.

We have invented electronic devices using cadmium boracite single crystals having at least one silver electrode, or other metal which forms a non-blocking contact, as high temperature symmetric and asymmetric current controlling devices, rectifiers, or temperature sensors. In addition, we expect polycrystalline cadmium boracite crystals to function in a similar manner to single crystals. The cadmium boracite crystal devices exhibit low conductivity (high resistivity) state independent of applied voltage up to a temperature at which the device switches to a high conductivity (low resistance) state. The critical-field strength required for switching at the operative temperature is from between about $10^2$ to about $10^3$ volts/centimeter (V/cm), which is at least one or two orders of magnitude smaller than that exhibited in most amorphous semiconductors.

The resistance of cadmium boracite crystals is typically on the order of about $10^6$ to about $10^7$ ohms in the low conductivity or "off" state. Generally, the thicker the crystal used in the device, the higher the threshold temperature for the crystal to change from the low conductivity state to the high conductivity state. It has been determined that upon cooling the device below the operative temperature, the device exhibits a temperature hysteresis.

Figure 1:
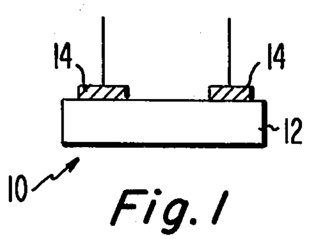
FIG. 1 illustrates a coplanar device with symmetric electrodes.

Turning now to the drawings, FIG. 1 illustrates a coplanar device 10 with a body 12 of cadmium boracite and silver electrodes 14.

Figure 2:
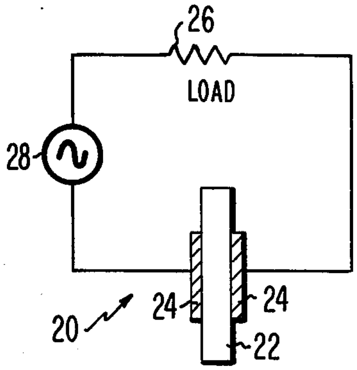
FIG. 2 is a sandwich style device with symmetric electrodes in a circuit used for measuring threshold voltages and DC and DC pulse.

FIG. 2 illustrates a symmetrical sandwich type device 20 comprising a body of cadmium boracite crystal 22 and silver electrodes 24 in a circuit for testing DC or DC pulse switching. A 100KΩ resistance 26 and power source 28 supplies regulated DC or DC pulse threshold voltages.

Threshold voltages, at various temperatures for two devices, similar to FIG. 2, with a crystal thickness of 0.48 mm and 1.06 mm, respectively, and a pulse width varying from $10^{-2}$ to $10^{-6}$ second duration and a constant duty of about 0.1, are given in Table I below. The duty is defined as the average pulse length (sec) times the average pulse repetition ($sec^{-1}$).

TABLE I

| Crystal thickness | | 0.48 mm | | 1.06 mm | | |
|---|---|---|---|---|---|---|
| Device temperature | | 340° C. | 400° C. | 322° C. | 355° C. | 392° C. |
| | dc | 1.7 V | 0.75 V | >10 V | >10 V | 7.7 V |
| Pulse Width (sec) | $10^{-2}$ | 0.35 | — | 7 | 7 | 7.5 |
| | $10^{-3}$ | 0.25 | — | 7.5 | 7.5 | 5.7 |
| | $10^{-4}$ | 0.3 | — | 9 | 10 | 7 |
| | $10^{-5}$ | 1.2 | — | 10 | $\gtrsim$10 | 8 |
| | $10^{-6}$ | 2.0 | — | >10 | >10 | >10 |

As shown in Table I, the change in crystal thickness by a factor of 2 brings about at least an order of magnitude difference in the threshold voltage. The Table further indicates that threshold voltage changes only gradually in the temperature range of from about 300° C. to about 400° C. This clearly illustrates that cadmium boracite devices are fairly stable over a wide temperature range. The crystal orientation, crystal species, i.e., cadmium boracite wherein X is chlorine (Cl) or bromine (Br) and electrode positioning does not appear to cause any significant changes in the characteristics thereof.

Either symmetrical coplanar devices of FIG. 1 or symmetrical sandwich type devices of FIG. 2 can function as temperature sensors with an applied voltage greater than the threshold voltage. Upon heating to or above the critical temperature the device becomes conducting and switches to the "on" state.

Figure 3:
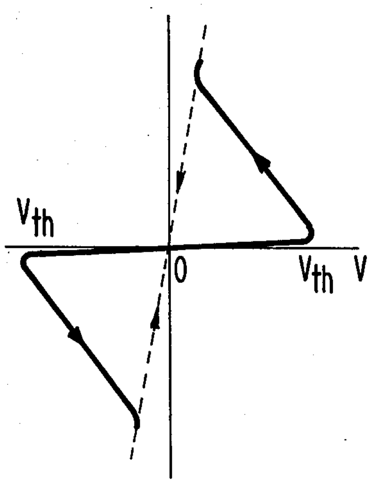
FIG. 3 illustrates the direct current versus voltage characteristics of a cadmium boracite crystal, with symmetric electrodes, switching at a temperature greater than the threshold temperature ($T_c$).

FIG. 3 illustrates the current-voltage characteristics for the symmetric switching devices such as those depicted in FIGS. 1 and 2 which are symmetric with respect to polarity reversal. Before switching, the current is determined by the resistance of the crystal since it is much larger than the load resistance 26 of FIG. 2. After the threshold voltage ($V_{th}$) is exceeded, a negative resistance region appears. In the "on" state, i.e., high conductivity state, the dynamic resistance of the sample, dV/dI, takes a small positive value or about 0 value.

Unlike the case of threshold switching in amorphous semiconductors, there does not exist a critical current, or so called holding current at which the sample abruptly switches back to the "off" state. When the applied voltage is decreased, the sample gradually returns to the "off" state. Therefore, the device resistance in the "on" state cannot be clearly defined. The threshold voltage $V_{th}$ is dependent upon the temperature and decreases as the temperature increases.

Figure 4:
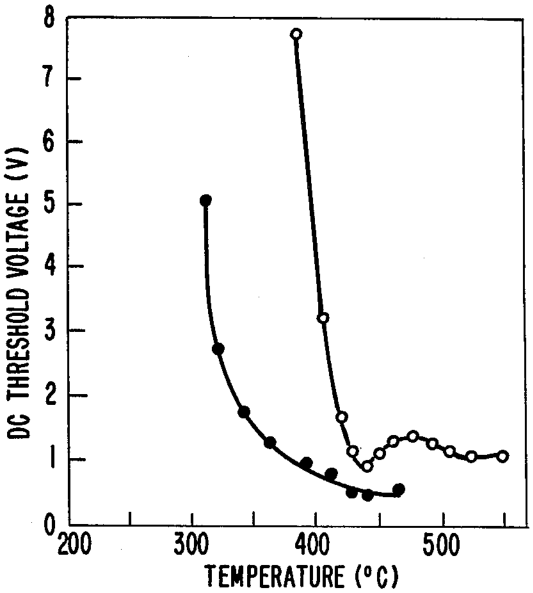
FIG. 4 is a temperature versus direct current threshold voltage ($V_{th}$) for a cadmium boracite sandwich device wherein the electrode distance is about 1.05 mm and about 0.48 mm.

FIG. 4 illustrates the decreasing threshold voltage ($V_{th}$) as a function of increasing temperature for a device with an electrode distance of 0.48 mm, depicted by solid circles, and a second device with an electrode distance of about 1.05 mm, depicted by the open circles.

An apparent critical temperature $T_c$, which is obtained by extrapolating $V_{th}$ to infinity, is dependent upon sample thickness: the thicker the sample, the higher the $T_c$. $V_{th}$ is not a linear function of thickness and the critical field increases with thickness.

When a device is kept in the high conductivity state, i.e., the "on" state, at a constant temperature, a stabilization of the conductive state occurs. That is, if the "on" state is maintained for a short time, the $V_{th}$ measured immediately afterwards is considerably smaller than the previous $V_{th}$. After repeated switchings, the "on" state is temporarily stabilized.

The cadmium boracite crystals exhibit switching with DC pulses at a critical temperature, however, the crystal initially exhibits unstable switching which changes to stable switching as the DC pulse voltages are increased. Generally, the unstable and switchable $V_{th}$ increase as the pulse length decreases. The switchable $V_{th}$ is at least about three or four times larger than the unswitchable $V_{th}$. When the applied voltage is kept constant, there exists a critical pulse rate, at which unstable switching takes place. The critical pulse repetition rate increases with decreasing pulse length.

Table II below illustrates the change from unstable switching to stable switching as the voltage is increased in a 0.48 mm thick $Cd_3B_7O_{13}Cl$ crystal at a temperature of 340±2° C. The data were taken under constant duty operation. (duty-0.1)

TABLE II

| Pulse width (sec) | Pulse repetition (pulses/sec) | $V_{th}$unstable (V) | $V_{th}$ stable (V) |
|---|---|---|---|
| $10^{-6}$ | $10^5$ | 2 | 7-8 |
| $10^{-5}$ | $10^4$ | 1.2 | 3 |
| $10^{-4}$ | $10^3$ | 0.2-0.4 | 4 |
| $10^{-3}$ | $10^2$ | 0.2-0.3 | 4 |
| $10^{-2}$ | 10 | 0.3-0.4 | 3 |

In general, cadmium boracite devices work well for AC currents. The Table below summarizes AC threshold voltage at 341° C. for a $Cd_3B_7O_{13}Br$ crystal coplanar electrode device as in FIG. 1 with an electrode distance of 0.2 mm.

TABLE III

| | | | | | |
|---|---|---|---|---|---|
| AC frequency (Hz) | 5 | 10 | 50 | 100 | 500 |
| AC threshold (volts) | 0.3 | 0.4 | 1.5 | 2.0 | 4.8 |

Figure 5:
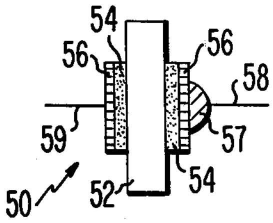
FIGS. 5 and 6 illustrate asymmetric current controlling devices.

FIG. 5 illustrates an asymmetric device, i.e., only one silver elctrode wherein current flow is in only one direction. More specifically, device 50 comprises a body 52 of cadmium boracite single crystal contacted by vacuum evaporated chromium films 54 and vacuum evaporated gold films 56. In addition, one side of the device 50 has a silver conductive paint 57 contacting the vacuum evaporated gold film 56. The DC current flows from 58 to 59. When the polarity of the applied voltage is reversed, no current flows even if the magnitude of the voltage is in excess of a threshold voltage for the other direction.

Figure 6:
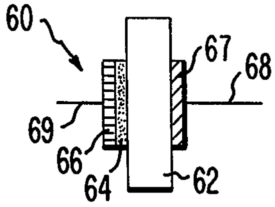

Another asymmetric device is depicted in FIG. 6. The device 60 comprises a body 62 of cadmium boracite with a vacuum evaporated chromium film 64 contacting the body 62 and a vacuum evaporated gold film 66 contacting film 64 to form an electrode on one side of body 62, with a silver electrode 67 of silver conducting paint on the other side of body 62. The current flows from 68 to 69 with no reverse current when the applied voltage is reversed.

Figure 7:
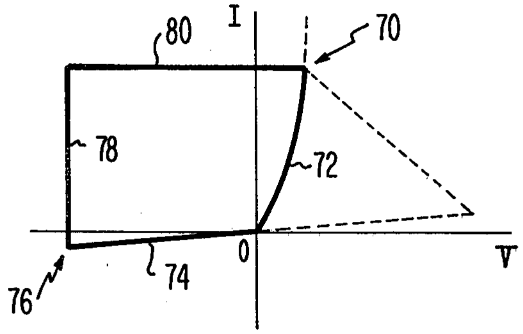
FIG. 7 illustrates a typical current versus voltage curve for an asymmetric electrode device.

FIG. 7 illustrates a typical current voltage curve for an asymmetric device such as those shown in FIGS. 5 and 6. The dotted lines indicate the tracings of a symmetric device depicted in first quadrant of FIG. 3. In the forward direction, the current of the high conductivity, "on" state is at 70. When the polarity of the voltage is reversed at 70, the current falls to 76, i.e., low conductivity, high resistance "off" state via 72 and 74. When the voltage is again returned to the positive direction the current increases to 70 via 78 and 80. The silver electrodes are presently preferred to form non-blocking contacts with the boracite crystal but, other non-blocking electrodes may be employed. Silver conducting paint, vacuum evaporated silver, or other silver contacts known in the art will form non-blocking contacts.

No threshold voltage exists for cadmium boracite devices not containing at least one silver-containing electrode or other non-blocking electrode. Tests indicate that no threshold voltage exists for the DC or DC pulse and the sample stays in the low conductivity, i.e., high resistance state.

Figure 8:
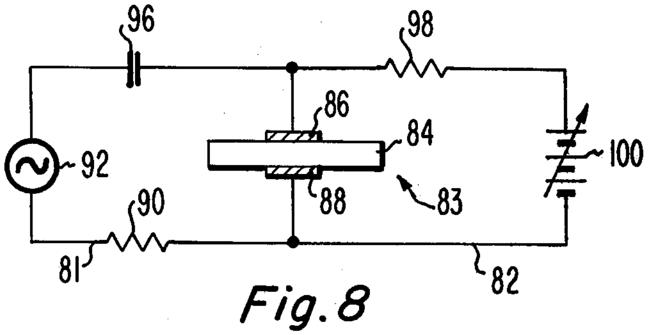
FIG. 8 illustrates an asymmetric electrode device for half-wave rectification of alternating current.
Figure 9:
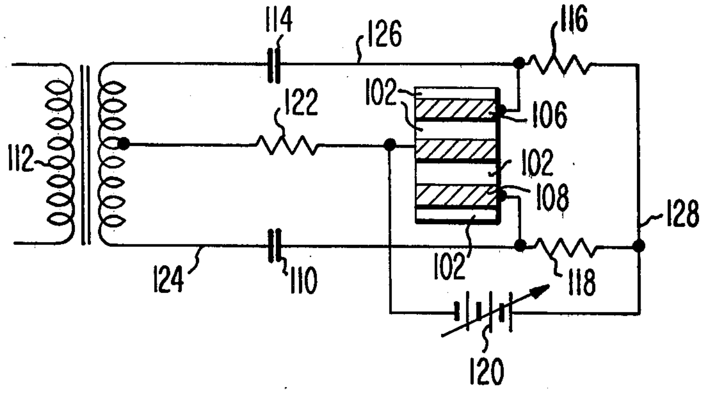
FIG. 9 illustrates a coplanar trielectrode device for full wave rectification of alternating current.

Unlike the asymmetric cadmium boracite device's ability to rectify DC or DC pulse circuits, no rectification of AC was obtained with the asymmetric devices of FIGS. 5 and 6. Rectification with asymmetric devices was possible when a DC bias was applied simultaneously with the application of an AC bias. FIGS. 8 and 9 refer to asymmetric devices capable of inducing rectification of AC.

FIG. 8 refers to a circuit capable of inducing rectification with symmetric or asymmetric devices. The AC circuit 81 consists of an AC source 92, and a load resistance 90 and a blocking capacitance 96. The DC control circuit 82 consists of a variable DC voltage source 100 and a large protective resistance 98 that blocks AC current. When an AC voltage equal to the threshold or smaller is applied to device 83 and then a DC voltage is applied, a regulated current flows through load resistance 90 at a certain DC voltage.

The device 83 consists of cadmium boracite crystal 84 and a non-silver electrode 86 and a silver electrode 88. The direction of the regulated current is dictated by the polarity of the DC voltage. When a DC voltage becomes too large, then the "on" state or high conductivity state is stabilized and the rectifying effect disappears.

For example in symmetric electrical devices, the polarity reversal of a DC bias brings about a symmetric regulating current as expected. There exists an upper limit of AC frequency for the rectifying effect to be observed and that is on the order of several hundred hertz, about 500 Hz, for sinusoidal AC. This is undoubtedly related to the slow recovery from the "on" state to the "off" state.

Table IV shows the lower and upper limits of the DC bias for various load resistances 90 measured in the circuit of FIG. 8 with a symmetric device while other parameters are kept constant. The measurements were made for a blocking capacitance 96 of 10 μF, resistance 98 is 100kΩ and a crystal thickness of 0.3 mm. The $V_{ac}$ was 0.05 volt and the AC frequency was 50 Hz at a sample temperature of 341° C.

TABLE IV

| Resistance of 90 (ohms) | $i_{ac}$ (μa) | $V_{dc}$ for AC regulated current (volts) Minimum | Maximum |
|---|---|---|---|
| 100 | 460 | 4 | 14 |
| 500 | 62 | 2 | 7 |
| 1,000 | 41 | 1.05 | 4.0 |
| 3,000 | 11 | 0.65 | 2.0 |
| 10,000 | 3.7 | 0.2 | 0.75 |

Worth noting, the DC bias voltage both minimum and maximum required for the rectifying effect to take place, increases with increasing current or power in the AC circuit. Although we are unable to explain the effect, the skilled artisan would realize that the response of cadmium boracite devices is different when AC and DC are applied simultaneously as compared to the case of only applying one or the other. The efficiency of the rectification, which is arbitrarily defined by the forward current versus the reverse current ratio is improved by decreasing of the load resistance 90.

When an asymmetric device is used, a larger DC bias is necessary for rectification when the non-silver electrode is made positive as compared with the case of forward bias than when it is negative. The minimum DC bias voltage increases with increasing AC voltage and AC frequency, as illustrated by Table V.

TABLE V

| | | AC frequency (Hz) 5 | 10 | 50 | 100 | 500 |
|---|---|---|---|---|---|---|
| AC voltage (volts) | 0.5 | 1.3 | 2.6 | 2.9 | 4.5 | 5.6 |
| | 1.0 | 1.4 | 3.0 | 3.6 | 5.0 | 6.0 |
| | 1.5 | 5.6 | 6.7 | unstable up to 16V | unstable up to 16V | unstable up to 16V |

For the above measurements, the asymmetric device 83 of FIG. 8 was employed. The capacitances 96 and 10 μF and the resistance 98 was 100kΩ and the temperature 393±1° C.

While the circuit of FIG. 8 is used for halfwave rectification of AC, the circuit of FIG. 9 is capable of full wave rectification. FIG. 9 contains a coplanar trielectrode, however, a sandwich type electrode device can also be used. Side electrodes 106 and 108 are positively biased chromium-gold-silver paste electrodes whereas central electrode 104 is a negatively biased chromium gold silver paste electrode. The first half of the AC cycle flows through capacitor 114 via 126 to the cadmium boracite crystal 102 via electrodes 104 and 106 and thereafter through resistance 122. The second half of the AC cycle flows through capacitor 110 via 124 to the crystal via electrodes 104 and 108 so the full wave rectification will be completed. When the polarity of the side electrodes 106 and 108 and the center electrode 104 is reversed, the direction of the current through the load is also reversed. The AC frequencies are supplied by AC frequency coil 112. The DC part of the circuit 128 includes a DC voltage source 120 and resistors 116 and 118.

Table VI illustrates the minimum DC biased voltages for total wave rectification for various 50 hertz AC voltages as shown. Capacitors 114 and 110 are 10 μF, the resistances 116 and 118 are 100kΩ and the resistance 122 is 100Ω.

TABLE VI

| $V_{ac}$ (volts) | minimum $V_{dc}$ (volts) |
|---|---|
| 0.2 | 4.3 |
| 0.5 | 6.4 |
| 1.0 | 10.4 |
| 2.0 | 16.0 |
| 3.0 | >16.0 |

As in the case of half wave rectification, the minimum DC bias voltage increases with increasing voltage.

While the foregoing devices have been described with respect to specific device parameters such as interelectrode distances, load resistances, blocking capacitances and temperatures for purposes of illustrating the present invention, other sets of such parameters are readily apparent to persons skilled in the art.

We claim:

1. An electronic device comprising:

a body of cadmium boracite crystal having first and second surfaces, said body fabricated by chemical vapor transport;

first electrode means electrically contacting said first surface; and second electrode means electrically contacting said first or second surface, wherein one of said electrodes contains silver and the other electrode is free of silver, said body and said electrodes exhibit a high electrical resistance state which is independent of applied alternating current or direct current voltage and a low electrical resistance state dependent upon applied alternating current or direct current voltage, said body and said electrodes change from said high electrical resistance state to said low electrical resistance state at a temperature of at least about 300° C.

2. A device according to claim 1 wherein said second electrode contacts said first surface.

3. A device according to claim 1 wherein said second electrode contacts said second surface.

4. A device according to claim 1 wherein said cadmium boracite crystal is selected from the group consisting of $Cd_3B_7O_{13}Cl$ and $Cd_3B_7O_{13}Br$.

5. A device according to claim 4 wherein said cadmium boracite crystal is single crystal.

6. An electronic switch comprising:

a body of cadmium boracite crystal having first and second surfaces, said body fabricated by chemical vapor transport;

first electrode means electrically contacting said first surface;

second electrode means electrically contacting said first or second surface, wherein one of said electrodes is silver or silver-coated and the other electrode is free of silver; and means for maintaining said body of cadmium boracite at a temperature of at least about 300° C., said body and said electrodes exhibit a high electrical resistance state which is independent of applied alternating current or direct current voltage and a low electrical resistance state dependent upon applied alternating current or direct current voltage.

7. A device according to claim 6 wherein said cadmium boracite crystal is a single crystal selected from the group consisting of $Cd_3B_7O_{13}Cl$ and $Cd_3B_7O_{13}Br$.

8. A temperature sensor comprising:

a body of single crystal cadmium boracite having first and second surfaces;

first silver electrode means electrically contacting said first surface;

second silver electrode means electrically contacting said first or second surface; and means for applying a voltage across said electrode in excess of the threshold voltage of said crystal wherein said crystal changes from a low conductivity state independent of applied voltage to a high conductivity state dependent upon an applied voltage.

9. A temperature sensor according to claim 8 wherein the body of cadmium boracite crystal is selected from the group consisting of $Cd_3B_7O_{13}Cl$ and $Cd_3B_7O_{13}Br$.

10. An asymmetric electronic device comprising:

a body of cadmium boracite crystal having first and second surfaces;

first electrode means electrically contacting said first surface; and second electrode means electrically contacting said first or second surface, wherein one of said electrodes is silver or silver-coated and the other electrode is free of silver.

11. The asymmetric electronic device in accordance with claim 10 further incorporating means for maintaining said body of cadmium boracite at a temperature of at least about 300° C.

* * * * *